United States Patent
Hammes

(10) Patent No.: US 7,134,120 B2
(45) Date of Patent: Nov. 7, 2006

(54) MAP COMPILER PIPELINED LOOP STRUCTURE

(75) Inventor: Jeffrey Hammes, Colorado Springs, CO (US)

(73) Assignee: SRC Computers, Inc., Colorado Springs, CO (US)

( * ) Notice: Subject to any disclaimer, the term of this patent is extended or adjusted under 35 U.S.C. 154(b) by 521 days.

(21) Appl. No.: 10/345,082

(22) Filed: Jan. 14, 2003

(65) Prior Publication Data
US 2004/0088673 A1    May 6, 2004

Related U.S. Application Data

(63) Continuation-in-part of application No. 10/285,299, filed on Oct. 31, 2002, now Pat. No. 6,983,456.

(51) Int. Cl.
*G06F 9/45*    (2006.01)

(52) U.S. Cl. .................. 717/155; 717/150; 717/156; 717/157

(58) Field of Classification Search ............ 717/132, 717/144, 150, 155–157
See application file for complete search history.

(56) References Cited

U.S. PATENT DOCUMENTS

| | | | |
|---|---|---|---|
| 5,230,057 A | | 7/1993 | Shido et al. |
| 5,570,040 A | | 10/1996 | Lytle et al. |
| 5,666,296 A | * | 9/1997 | Gafter .......................... 716/3 |
| 5,701,489 A | * | 12/1997 | Bates et al. .................. 717/157 |
| 5,737,766 A | | 4/1998 | Tan |
| 5,764,951 A | * | 6/1998 | Ly et al. ....................... 716/1 |
| 5,784,556 A | * | 7/1998 | Sanchez et al. ............. 709/248 |
| 5,892,962 A | | 4/1999 | Cloutier |
| 5,903,771 A | | 5/1999 | Sgro et al. |
| 5,930,510 A | * | 7/1999 | Beylin et al. ................ 717/161 |
| 6,023,755 A | | 2/2000 | Casselman |
| 6,052,773 A | | 4/2000 | DeHon et al. |
| 6,076,152 A | | 6/2000 | Huppenthal et al. |
| 6,192,439 B1 | | 2/2001 | Grunewald et al. |
| 6,226,776 B1 | | 5/2001 | Panchul et al. |

(Continued)

OTHER PUBLICATIONS

Callahan et al., "Adapting Software Pipelining for Reconfigurable Computing", ACM CASES'00 Nov. 2000, pp. 57-64.*

(Continued)

*Primary Examiner*—Kakali Chaki
*Assistant Examiner*—William H. Wood
(74) *Attorney, Agent, or Firm*—Michael C. Martensen; William J. Kubida; Hogan & Hartson LLP

(57) ABSTRACT

A control-flow dataflow graph pipelined loop structure that includes a loop body that processes an input value to generate an output value in successive iterations of the loop body, where the output value is captured by a circulate node coupled to the loop body, a loop valid node coupled to the loop body that determines a final loop iteration, and an output value storage node coupled to the circulate node, where the output value storage node ignores output values generated after the loop valid node determines the final loop iteration has occurred. Also, a control-flow dataflow graph pipelined loop structure that includes a loop body that processes an input value to generate an output value in successive iterations of the loop body, where the output value is captured by a circulate node coupled to the loop body, and a loop driver node coupled to the circulate node, where the loop driver node sets a period for each iteration of the loop body.

21 Claims, 6 Drawing Sheets

U.S. PATENT DOCUMENTS

| | | | |
|---|---|---|---|
| 6,286,135 B1* | 9/2001 | Santhanam | 717/146 |
| 6,374,403 B1* | 4/2002 | Darte et al. | 717/161 |
| 6,505,328 B1* | 1/2003 | Van Ginneken et al. | 716/7 |
| 6,507,947 B1* | 1/2003 | Schreiber et al. | 717/160 |
| 6,782,511 B1* | 8/2004 | Frank et al. | 716/1 |

OTHER PUBLICATIONS

Debray, Sauyma K.; "Unfold/Fold Transformations and Loop Optimization of Logic Programs"; ACM SIGPLAN '88, Conference on Programming Language Design and Implementation; Jun. 1988; pp. 297-307.*

Allan et al.; "Petri Net versus Modulo Scheduling for Software Pipelining"; IEEE Proceedings of MICRO-28; 1995; pp. 105-110.*

Agarwal, A., et al., "The Raw Compiler Project", pp. 1-12, http://cag-www.lcs.mit.edu/raw, Proceedings of the Second SUIF Compiler Workshop, Aug. 21-23, 1997.

Albaharna, Osama, et al., "On the viability of FPGA-based integrated coprocessors", © 1996 IEEE, Publ. No. 0-8186-7548-9/96, pp. 206-215.

Amerson, Rick, et al., "Teramac—Configurable Custom Computing", © 1995 IEEE, Publ No. 0-8186-7086-X/95, pp. 32-38.

Barthel Dominique Aug. 25-26, 1997, "PVP a Parallel Video coProcessor", Hot Chips IX, pp. 203-210.

Bertin, Patrice, et al., "Programmable active memories: a performance assessment", © 1993 Massachusetts Institute of Technology, pp. 88-102.

Bittner, Ray, et al., "Computing kernels implemented with a wormhole RTR CCM", © 1997 IEEE, Publ. No. 0-8186-8159-4/97, pp. 98-105.

Buell, D., et al. "Splash 2: FPGAs in a Custom Computing Machine—Chapter 1—Custom Computing Machines: An Introduction", pp. 1-11, http://www/computer.org/espress/catalog/bp07413/spla-ch1.html (orignally belleveled published in J. of Supercomputing, vol. IX, 1995, pp. 219-230.

Casselman, Steven, "Virtual Computing and The Virtual Computer", © 1993 IEEE, Publ. No. 0-8186-7/93, pp. 43-48.

Chan, Pak, et al., "Architectural tradeoffs in field-programmable-device-based computing systems", © 1993 IEEE, Publ. No. 0-8186-3890-7/93, pp. 152-161.

Clark, David, et al., "Supporting FPGA microprocessors through retargetable software tools", © 1996 IEEE, Publ. No. 0-8186-7548-9/96, pp. 195-103.

Cuccaro, Steven, et al., "The CM-2X: a hybrid CM-2/Xilink protype", © 1993 IEEE, Publ. No. 0-8186-3890-7/93, pp. 121-130.

Culbertson, W. Bruce, et al., "Exploring architectures for volume visualization on the Teramac custom computer", © 1996 IEEE, Publ. No. 0-8186-7548-9/96, pp. 80-88.

Culbertson, W. Bruce, et al., "Defect tolerance on the Teramac custom computer", © 1997 IEEE, Publ. No. 0-8186-8159-4/97, pp. 116-123.

Dehon, Andre, "DPGA-Coupled microprocessors: commdity IC for the early 21$^{st}$ century", © 1994 IEEE, Publ. No. 0-8186-5490-2/94, pp. 31-39.

Dehon, A., et al., "MATRIX A Reconfigurable Computing Device with Configurable Instruction Distribution", Hot Chips IX, Aug. 25-26, 1997, Stanford, California, MIT Artificial Intelligence Laboratory.

Dhaussy, Philippe, et al., "Global control synthesis for an MIMD/FPGA machine", © 1994 IEEE, Publ. No. 0-8186-5490-2/94, pp. 72-81.

Elliott, Duncan, et al., "Computational Ram: a memory-SIMD hybrid and its application to DSP", © 1992 IEEE, Publ. No. 0-7803-0246-X/92, pp. 30.6.1-30.6.4.

Fortes, Jose, et al., "Systolic arrays, a survey of seven projects", © 1987 IEEE, Publ. No. 0018-9162/87/0700-0091, pp. 91-103.

Gokhale, M., et al., "Processing in Memory: The Terasys Massively Parallel PIM Array" © Apr. 1995, IEEE, pp. 23-31.

Gunther, Bernard, et al., "Assessing Document Relevance with Run-Time Reconfigurable Machines", © 1996 IEEE, Publ. No. 0-8186-7548-9/96, pp. 10-17.

Hagiwara, Hiroshi, et al., "A dynamically microprogrammable computer with low-level parallelism", © 1980 IEEE, Publ. No. 0018-9340/80/07000-0577, pp. 577-594.

Hartenstein, R. W., et al. "A General Approach in System Design Integrating Reconfigurable Accelerators," http://xputers.informatik.uni-kl.de/pagers/paper026-1.html, IEEE 1996 Conference, Austin, TX, Oct. 9-11, 1996.

Hartenstein, Reiner, et al., "A reconfigurable data-driven ALU for Xputers", © 1994 IEEE, Publ. No. 0-8186-5490-2/94, pp. 139-146.

Hauser, John, et al.: "GARP: a MIPS processor with a reconfigurable co-processor", © 1997 IEEE, Publ. No. 0-08186-8159-4/97, pp. 12-21.

Hayes, John, et al., "A microprocessor-based hypercube, supercomputer", © 1986 IEEE, Publ. No. 0272-1732/86/1000-0006, pp. 6-17.

Herpel, H. -J., et al., "A Reconfigurable Computer for Embedded Control Applications", © 1993 IEEE, Publ. No. 0-8186-3890-7/93, pp. 111-120.

Hogl, H., et al., "Enable++: A second generation FPGA processor", © 1995 iEEE, Publ. No. 0-8186-7086-X/95, pp. 45-53.

King, William, et al., "Using MORRPH in an industrial machine vision system", © 1996 IEEE, Publ. No. 08186-7548-9/96, pp. 18-26.

Manohar, Swaminathan, et al., "A pragmatic approach to systolic design", © 1988 IEEE, Publ. no. CH2603-9/88/000463, pp. 463-472.

Mauduit, Nicolas, et al. ,"Lneuro 1.0: a piece of hardware LEGO for building neural network systems," © 1992 IEEE, Publ. No. 1045-9227/92, pp. 414-422.

Mirsky, Ethan A., "Coarse-Grain Reconfigurable Computing", Massachusetts Institute of Technology, Jun. 1996.

Mirsky, Ethan, et al., "MATRIX: A Reconfigurable Computing Architecture with Configurable Instruction Distribution and Deployable Resources", © 1996 IEEE, Publ. No. 0-8186-7548-9/96, pp. 157-166.

Morley, Robert E., Jr., et al., "A Massively Parallel Systolic Array Processor System", © 1988 IEEE, Publ. No. CH2603-9/88/0000/0217, pp. 217-225.

Patterson, David, et al., "A case for intelligent DRAM: IRAM", Hot Chips VIII, Aug. 19-20, 1996, pp. 75-94.

Peterson, Janes, et al., "Scheduling and partitioning ANSI-C programs onto multi-FPGA CCM architectures", © 1996 IEEE, Publ. No. 0-8186-7548-9/96, pp. 178-187.

Schmit, Herman, "Incremental reconfiguration for pipelined applications," © 1997 IEEE, Publ. No. 0-8186-8159-4/97, pp. 47-55.

Sitkoff, Nathan, et al., "Implementing a Genetic Algorithm on a Parallel Custom Computing Machine", Publ. No. 0-8186-7086-X/95, pp. 180-187.

Stone, Harold, "A logic-in-memory computer", © 1970 IEEE, IEEE Transactions on Computers, pp. 73-78, Jan. 1990.

Tangen, Uwe, et al., "A parallel hardware evolvable computer POLYP extended abstract", © 1997 IEEE, Publ. No. 0-8186-8159/4/97, pp. 238-239.

Thornburg, Mike, et al., "Transformable Computers", © 1994 IEEE, Publ. No. 0-8186-5602-6/94, pp. 674-679.

Tomita, Shinji, et al., "A computer low-level parallelism QA-2", © 1986 IEEE, Publ. No. 0-0384-7495/86/0000/0280, pp. 280-289.

Trimberger, Steve, et al., "A time-multiplexed FPGA", © 1997 IEEE, Publ. No. 0-8186-8159-4/97, pp. 22-28.

Ueda, Hirotada, et al., "A multiprocessor system utilizing enhanced DSP's for image processing", © 1988 IEEE, Publ. No. CH2603-9/88/0000/0611, pp. 611-620.

Villasenor, John, et al., "Configurable computing", © 1997 Scientific American, Jun. 1997.

Wang, Quiang, et al., "Automated field-programming compute accelerator design using partial evaluation", © 1997 IEEE, Publ. No. 0-8186-8159-4/97, pp. 145-154.

W.H. Mangione-Smith and B.L. Hutchings. Configurable computing: The Road Ahead. In Proceedings of the Reconfigurable Architectures Workshop (RAW'97), pp. 81-96, 1997.

Wirthlin, Michael, et al., "The Nano processor: a low resource reconfigurable processor", © 1994 IEEE, Publ. No. 0-8186-5490-2/94, pp. 23-30.

Wirthlin, Michael, et al., "A dynamic instruction set computer", © 1995 IEEE, Publ. No. 0-8186-7086-X/95, pp. 99-107.

Wittig, Ralph, et al., "One Chip: An FPGA processor with reconfigurable logic", © 1996 IEEE, Publ. No. 0-8186-7548-9/96, pp. 126-135.

Yamauchi, Tsukasa, et al., "SOP: A reconfigurable massively parallel system and its control-data flow based compiling method", © 1996 IEEE, Publ. No. 0-8186-7548-9/96, pp. 148-156.

"Information Brief", PCI Bus Technology, © IBM Personal Computer Company, 1997, pp. 1-3.

Yun, Hyun-Kyu and Silverman, H. F.; "A distributed memory MIMD multi-computer with reconfigurable custom computing capabilities", Brown University, Dec. 10-13, 1997, pp. 7-13.

Hoover, Chris and Hart, David; "San Diego Supercomputer center, Timelogic and Sun Validate Ultra-Fast Hidden Markov Model Analysis-One DeCypher-accelerated Sun Fire 6800 beats 2,600 CPUs running Linux-", San Diego Supercomputer Center, http://www.sdsc.edu/Press/02/050802_markovmodel.html, May 8, 2002, pp. 1-3.

Caliga, David and Barker, David Peter, "Delivering Acceleration: The Potential for Increased HPC Application Performance Using Reconfigurable Logic", SRC Computer, Inc., Nov. 2001, pp. 20.

Hammes, J.P., Rinker, R. E., McClure, D. M., Böhm, A. P. W., Najjar, W. A., "The SA-C Compiler Dataflow Description", Colorado State University, Jun. 21, 2001, pp. 1-25.

Callahan, Timothy J. and Wawrzynek, John, "Adapting Software Pipelining for Reconfigurable Computing", University of California at Berkeley, Nov. 17-19, 2000, pp. 8.

Ratha, Nalini K., Jain, Anil K. and Rover, Diane T., "An FPGA-based Point Pattern Matching Processor with Application to Fingerprint Matching", Michigan State University, Department of Computer Science, pp. 8.

Dehon, André, "Comparing Computing Machines", University of California at Berkeley, Proceedings of SPIE vol. 3526, Nov. 2-3, 1998, pp. 11.

Vemuri, Ranga R. and Harr, Randolph E., "Configurable Computing: Technology and Applications", University of Cincinnati and Synopsys Inc., Apr. 2000, pp. 39-40.

Dehon, André, "The Density Advanatage of Configurable Computing", California Institute of Technology, IEEE, Apr. 2000 pp. 41-49.

Haynes, Simon D., Stone, John, Cheung, Peter Y.K. and Luk, Wayne, "Video Image Processing with the Sonic Architecture", Sony Broadcast & Professional Europe, Imperial College, University of London, IEEE, Apr. 2000, pp. 50-57.

Platzner, Marco, "Reconfigurable Accelerators for Combinatorial Problems", Swiss Federal Institute of Technology (ETH) Zurich, IEEE, Apr. 2000, pp. 58-60.

Callahan, Timothy J., Hauser, John R. and Wawrzynek, John, "The Garp Architecture and C Compiler", University of California, Berkeley, IEEE, Apr. 2000. pp. 62-69.

Goldstein, Seth Copen, Schmit, Herman, Budiu , Mihai, Cadambi, Srihari, Moe, Matt and Taylor, R. Reed, "PipeRench: A Reconfigurable Architecture and Compiler", Carnegie Mellon University, IEEE, Apr. 2000, pp. 70-76.

Muchnik, Steven S., "Advanced Compiler Design and Implementation", Morgan Kaufmann Publishers, pp. 217.

Hammes, Jeffrey P., Dissertation "Compiling SA-C To Reconfigurable Computing Systems", Colorado State University, Department of Computer Science, Summer 2000, pp. 179.

Automatic Target Recognition, Colorado State University & USAF, http://www.cs.colostate.edu/cameron/applications.html, pp. 1-3.

Chodowiec, Pawel, Khuon, Po, Gaj, Kris, Fast Implementations of Secret-Key Block Ciphers Using Mixed Inner- and Outer-Round Pipelining, George Mason University, Feb. 11-13, 2001, pp. 9.

Callahan, Timothy J., Wawrzynek, John, Adapting Software Pipelining for Reconfigurable Computing, University of California at Berkeley, Nov. 17-19, 2000, ACM CASES'00 , San Jose, CA, pp. 57-64.

Allan, V.H., Shah, U.R., Reddy, K.M., Petri Net versus Modulo Scheduling for Software Pipelining, Department of Computer Science, Utah State University, 1995, IEEE Proceedings of MICRO-28, pp. 105-110.

* cited by examiner

MAP COMPILER PIPELINED LOOP STRUCTURE

CROSS REFERENCE TO RELATED APPLICATIONS

The present application is a continuation-in-part of U.S. patent application Ser. No. 10/285,299 filed Oct. 31, 2002 now U.S. Pat. No. 6,983,456 for "Process For Converting Programs In High-Level Programming Languages To A Unified Executable For Hybrid Computing Platforms", assigned to SRC Computers, Inc., Colorado Springs, Colo., assignee of the present invention, the disclosure of which is herein specifically incorporated by this reference.

COPYRIGHT NOTICE/PERMISSION

A portion of the disclosure of this patent document contains material which is subject to copyright protection. The copyright owner has no objection to the facsimile reproduction by anyone of the patent document of the patent disclosure as it appears in the United States Patent and Trademark Office patent file or records, but otherwise, reserves all copyright rights whatsoever. The following notice applies to the software and data and described below, inclusive of the drawing figures where applicable: Copyright© 2002, SRC Computers, Inc.

BACKGROUND OF THE INVENTION

1. Field of the Invention

The present invention relates to pipelined loop structures that are produced by reconfigurable hardware compilers. More specifically, the invention relates to compiling pipelined loop structures that have a variable number of loop cycles and variable length clock latency.

2. Relevant Background

As instruction processors continue to increase rapidly in processing power, they are used more often to do computationally intensive calculations that were once exclusively done by supercomputers. However, there are still computationally intensive tasks, including, for example, compute-intensive image processing and hydrodynamic simulations that remain impractical to do on modem instruction processors.

Reconfigurable computing is a technology receiving increased interest in the computing arts. Traditional general purpose computing is characterized by computer code executed serially on one or more general purpose processors. Reconfigurable computing is characterized by programming reconfigurable hardware, such as Field Programmable Gate Arrays (FPGAs) to execute logic routines.

Reconfigurable computing offers significant performance advances in computation-intensive processing. For example, the reconfigurable hardware may be programmed with a logic configuration that has more parallelism and pipelining characteristics than a conventional instruction processor. Also, the reconfigurable hardware may be programmed with a custom logic configuration that is very efficient for executing the tasks assigned by the program. Furthermore, dividing a program's processing requirements between the instruction processor and the reconfigurable hardware may increase the overall processing power of the computer.

Software programs that are written in a high level language like, for example, C or Fortran can be converted into software that is executable in reconfigurable hardware with Multi-Adaptive Processor ("MAP") compilers. Loop structures in the high level language may be converted by the MAP compiler into a form that exploits parallelism and pipelining characteristics of reconfigurable hardware.

Unfortunately, existing MAP compilers only work with a small subset of all loop structures where the loops have a predetermined number of loop iterations before the loop terminates and that have periods of one clock, among other requirements. Thus, there remains a need for compilers that can compile loop structures where the loop does not terminate after a predetermined number of iterations and where the loop has a period greater than one clock.

SUMMARY OF THE INVENTION

Accordingly, an embodiment of the invention includes a control-flow dataflow graph pipelined loop structure that comprises a loop body that processes an input value to generate an output value in successive iterations of the loop body, wherein the output value is captured by a circulate node coupled to the loop body, a loop valid node coupled to the loop body that determines a final loop iteration, and an output value storage node coupled to the circulate node, wherein the output value storage node ignores output values generated after the loop valid node determines the final loop iteration has occurred.

Another embodiment of the invention includes a control-flow dataflow graph pipelined loop structure that comprises a loop body that processes an input value to generate an output value in successive iterations of the loop body, wherein the output value is captured by a circulate node coupled to the loop body, and a loop driver node coupled to the circulate node, wherein the loop driver node sets a period for the loop, that is, the number of clocks that will occur between activation of two successive loop iterations.

Additional novel features shall be set forth in part in the description that follows, and in part will become apparent to those skilled in the art upon examination of the following specification or may be learned by the practice of the invention. The features and advantages of the invention may be realized and attained by means of the instrumentalities, combinations, and methods particularly pointed out in the appended claims.

DETAILED DESCRIPTION OF THE INVENTION

In simple loop functions, a loop iterates a fixed and predetermined number of times and then stops after a final loop iteration. In contrast, more complex loop functions can iterate an unpredictable number of times until a condition is met, rather than terminating after a fixed number of iterations. These more complex loop functions may also continue run after the final loop iteration, making it difficult for an output value storage node to capture the final loop iteration output value instead of an output that may follow the final value.

The present invention includes pipelined loop structures and methods of loop pipelining that include loop functions that iterate for an unpredictable number of times until a condition is met. An embodiment of the invention includes a loop valid node that takes information that is generated for each loop iteration and determines whether that information indicates a final loop iteration. For example, the information generated for each loop iteration may be processed by the loop valid node to determine if a condition is satisfied that calls for the termination of the loop. If the condition is satisfied, then the loop valid node can alert other nodes like a termination node and an output value storage node that the next output value from the loop is the final loop iteration output value.

Many pipelined loop functions also require periods that are greater than one clock per iteration. These loop functions may not be compatible with pipelined loop structures that only operate at a frequency of one input or output value per clock cycle. In the present invention, a loop driver node may be provided that can adjust the period such that one or more clock cycles pass between values being input to the loop body. In an embodiment of the invention, a loop driver node accepts a period value "D" whose value represents the number of clock cycles that pass between inputs and/or outputs of the loop function.

Figure 1:
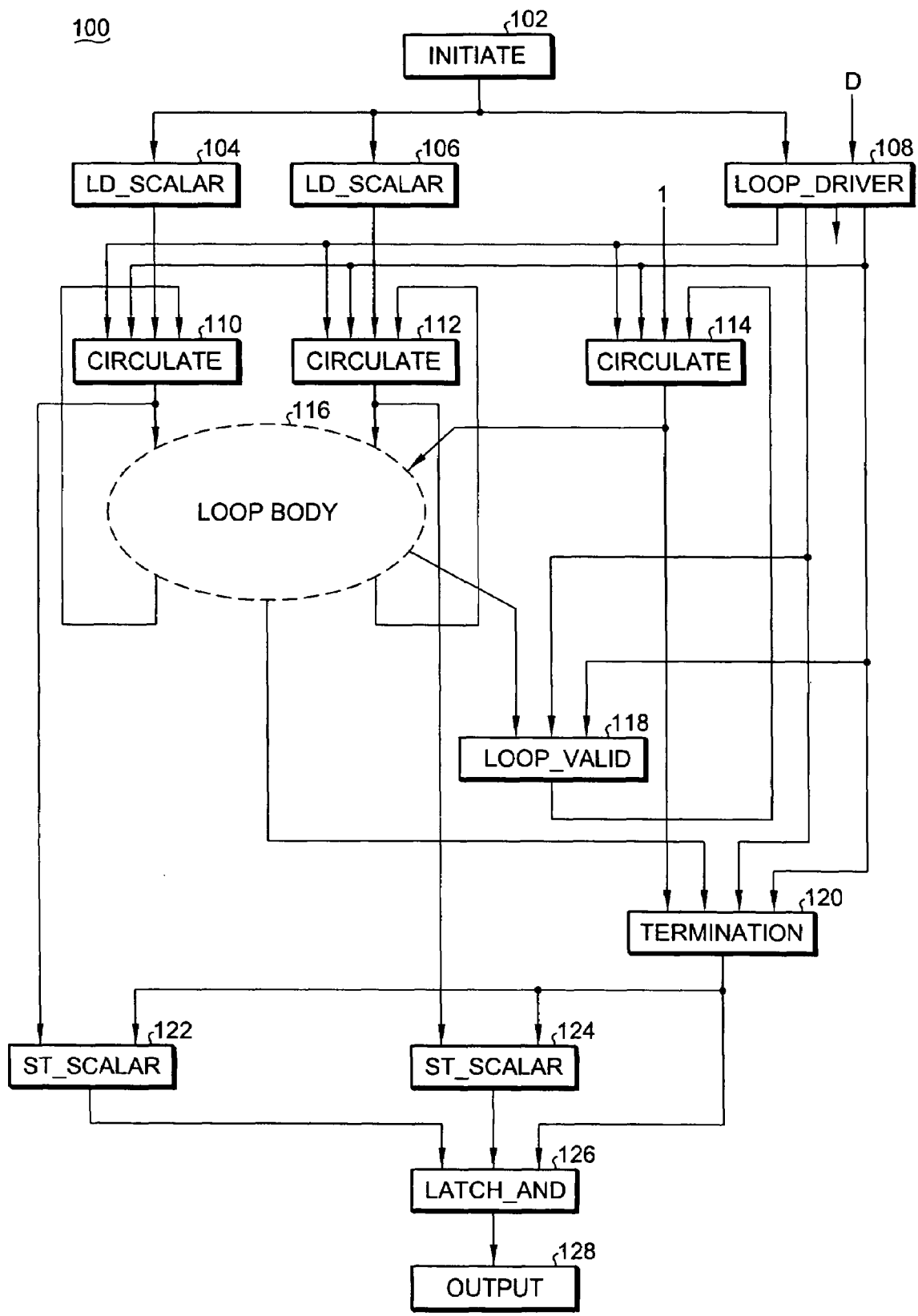
FIG. 1 shows an example of an control-dataflow graph pipelined loop structure according to an embodiment of the invention.

Referring now to FIG. 1, an embodiment of a pipelined loop structure 100 according to the present invention is shown. The pipelined loop structure 100 starts with an initiate node 102 that sends a signal to the load scalar nodes 104, 106 and the loop driver node 108 to begin executing the loop function. The loop driver node 108 then signals the circulate nodes 110, 112, 114 to load their initial values from the load scalar nodes 104, 106 and present the values to the loop body 116. On each iteration of the loop body 116, the circulate nodes 110, 112, 114 capture the output values generated in that iteration of the loop body 116 and prepares to send them as input values for the next iteration of the loop body 116.

As described below in more detail, the loop driver node 108 can accept an input labeled as "D" whose value represents the number of additional clock cycles that occur between loop iterations. For example, for D=0 there is one clock cycle per iteration, and if D=1 then there are two clock cycles per iteration.

The D value may be fixed for all iterations of the loop function, or in more complex loop function behavior, it may vary between loop iterations. The D value may be manually input by a programmer, or it may be automatically calculated based on an analysis of the loop function. When the loop function is initiated, the loop driver node 108 uses the D value to determine the rate at which it activates other nodes in the pipelined loop structure 100 such as the circulate nodes 110, 112, 114.

Loop termination in the pipelined loop structure 100 may start with the loop valid node 118, which is in communication with the circulate node 114. In one embodiment, a loop termination signal, which may be represented by a single-bit value, is input into the loop valid node 118 to determine if a condition is satisfied that indicates the loop should be terminated. The loop valid node 118 will send an "invalid" output signal (also called a "false" signal) to the circulate node 114 and may latch itself into a state where it continues to send invalid output signals until the loop function is reinitiated.

After the circulate node 114 receives an invalid output signal from the loop valid node 118, the signal is passed to the termination node 120. The termination node 120 may then trigger the output value storage nodes 122, 124 to prepare to capture the final loop iteration output value from the final loop iteration of the loop body 116. This mechanism allows the output value storage nodes 122, 124 to capture the final loop iteration output value even if the loop continues to free-run after the final iteration.

Following loop termination and the storing of the final loop iteration output values in the output value storage nodes 122, 124, the values may be latched by a latch_and node 126 and then distributed through the output node 128. In the pipelined loop structure 100, the termination node 120 may also be coupled to the latch_and node 126 and may inform node 126 when to capture values from the output value storage nodes 122, 124.

Figure 2:
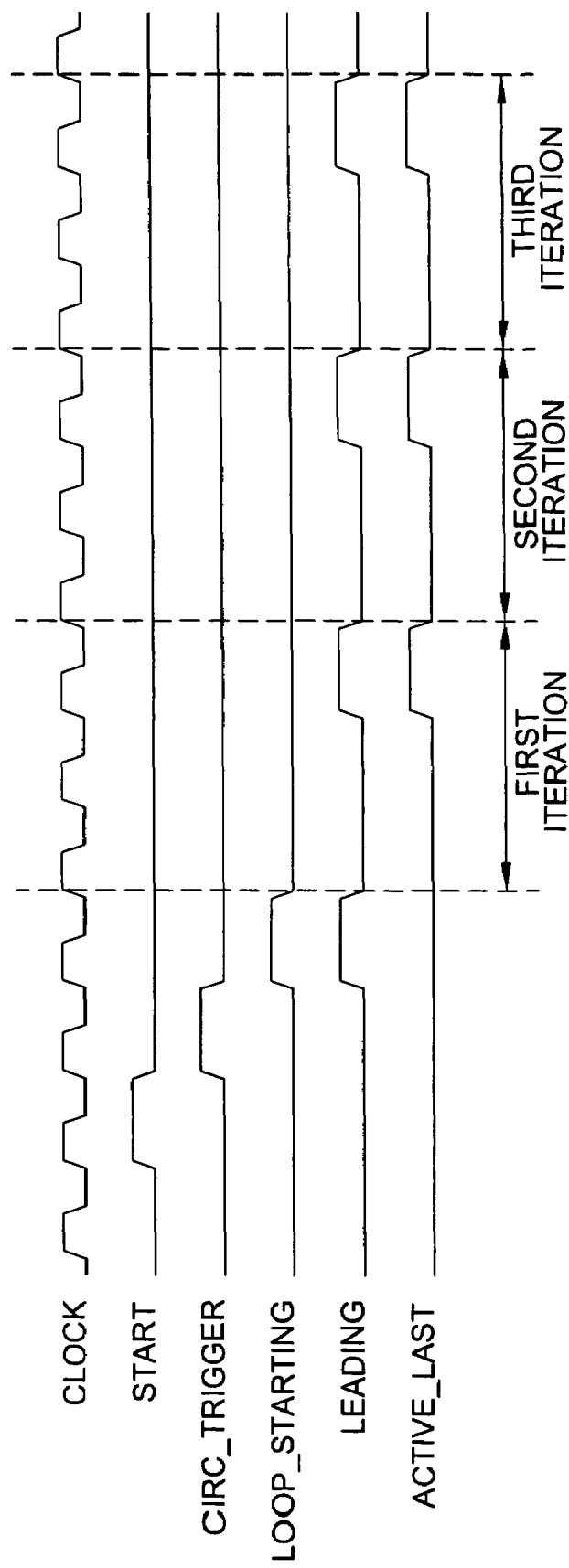
FIG. 2 shows an example of a timing diagram for a loop driver node where there are two clock cycles between loop iterations.

Referring now to FIG. 2, a timing diagram is shown for timing signals that may be included in the loop driver node 108 in FIG. 1. The CLOCK signal triggers the start of a clock cycle and is an input fed from the clock signal of the system. The START signal triggers the start of a loop. This signal is received from the initiate node 102. The CIRC_TRIGGER signal tells the circulate nodes that a loop is starting. This signal is an output that the circulate nodes 110, 112, 114 use to load their initial values. The LOOP_STARTING signal tells any nodes that require a reset pulse to clear their states for a new loop execution. The LEADING signal tells the periodic-input nodes that they should load their values. Finally, the ACTIVE_LAST signal goes high in the last clock of each iteration. This signal is used to indicate to nodes in the pipelined loop structure 100 that they have valid inputs.

Loop-carried scalar variables can create periods in the control-flow dataflow pipelined loop structure. The periods increase the number of clock cycles between loop iterations which, in turn, increase the D value need to insure that the loop body and circulate nodes are synchronized to capture the correct loop body output value for the start of each new loop iteration.

Figure 3:
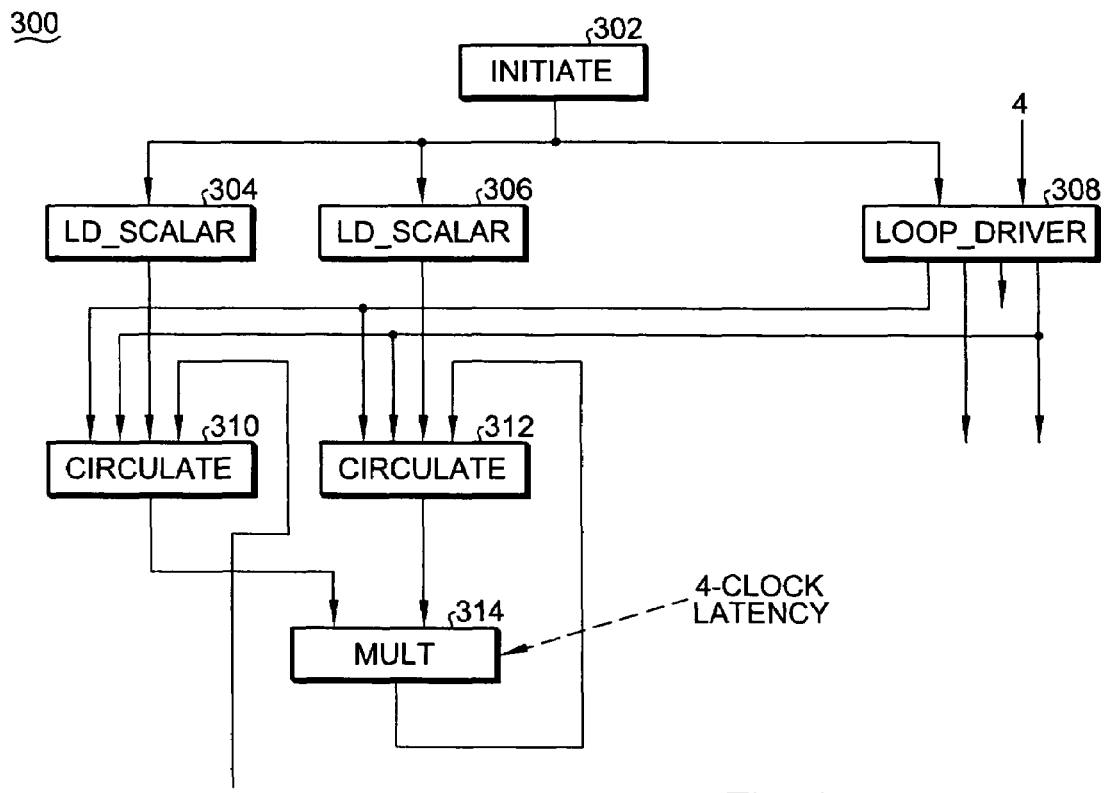
FIG. 3 shows an example of a control-dataflow graph pipelined loop structure having a loop with a loop-carried scalar cycle.

FIG. 3 shows an example of a portion of a pipelined loop structure 300 where the D value for the loop driver node 308 should be set to at least 4, representing 4 additional clock cycles per loop iteration. Similar to FIG. 1 above, the pipelined loop structure 300 starts with an initiate node 302 that sends a signal to load scalar nodes 304, 306 and the loop driver node 308. In this example, a value of D=4 is input into the loop driver node 308 to set the frequency of the loop structure at five clock cycles per loop iteration. The D=4 value is selected based on an inherent four clock cycle latency in the multiplication macro embodied by MULT node 314. By inputting D=4 into the loop driver node 308, circulate nodes 310, 312 input values into the MULT node 314 every five clock cycles.

Figure 4:
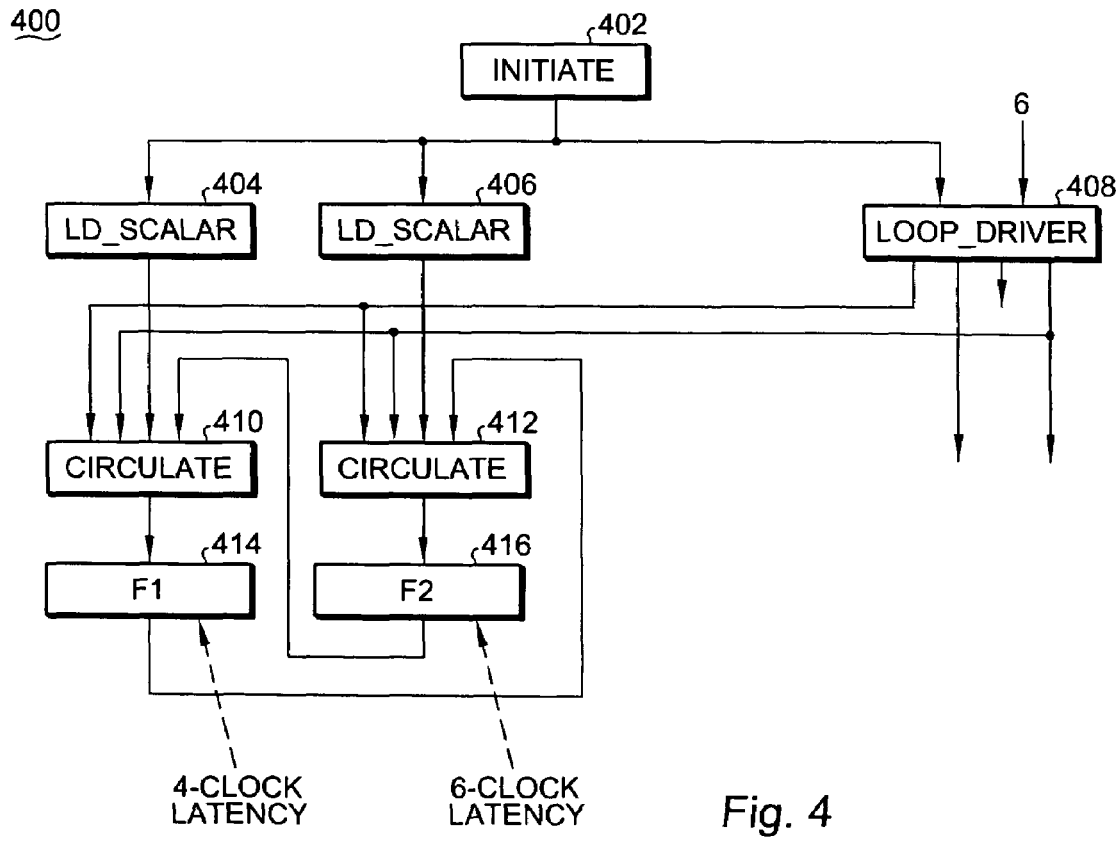
FIG. 4 shows an example of a control-dataflow graph pipelined loop structure having a loop with a loop-carried scalar cycle involving more than one circulate node.

Generally, the value of D is proportional to the longest path between the output and input of a circulate node in the pipelined loop structure. FIG. 3 provides a simple example where the outputs of circulate nodes 310, 312 are all sent to the MULT node 314 that sends the inputs directly back to the nodes 310, 312. Examples of some more complex loop functions, and their pipelined loop structures, now follow:

FIG. 4 shows a control-flow dataflow graph pipelined loop structure 400 with a first function (F1) node 414 having a latency of 4 clock cycles per loop iteration and a second function (F2) node 416 having a latency of 6 clock cycles per loop iteration. The pipelined loop structure 400 starts with an initiate node 402 that sends a signal to the load scalar nodes 404, 406 and the loop driver node 408. In this example, the value of D is selected based on the longest latency of any of the loop functions in the pipelined loop structure 400. The second function (F2) node has the longest latency with 6 clock cycles per loop iteration, so D has a value of six. The circulate nodes 410, 412 receive signals from the loop driver timed, based on the value of D, so that they input values to the first function (F1) node 414 and the second function (F2) node 416 every seven clock cycles.

Figure 5:
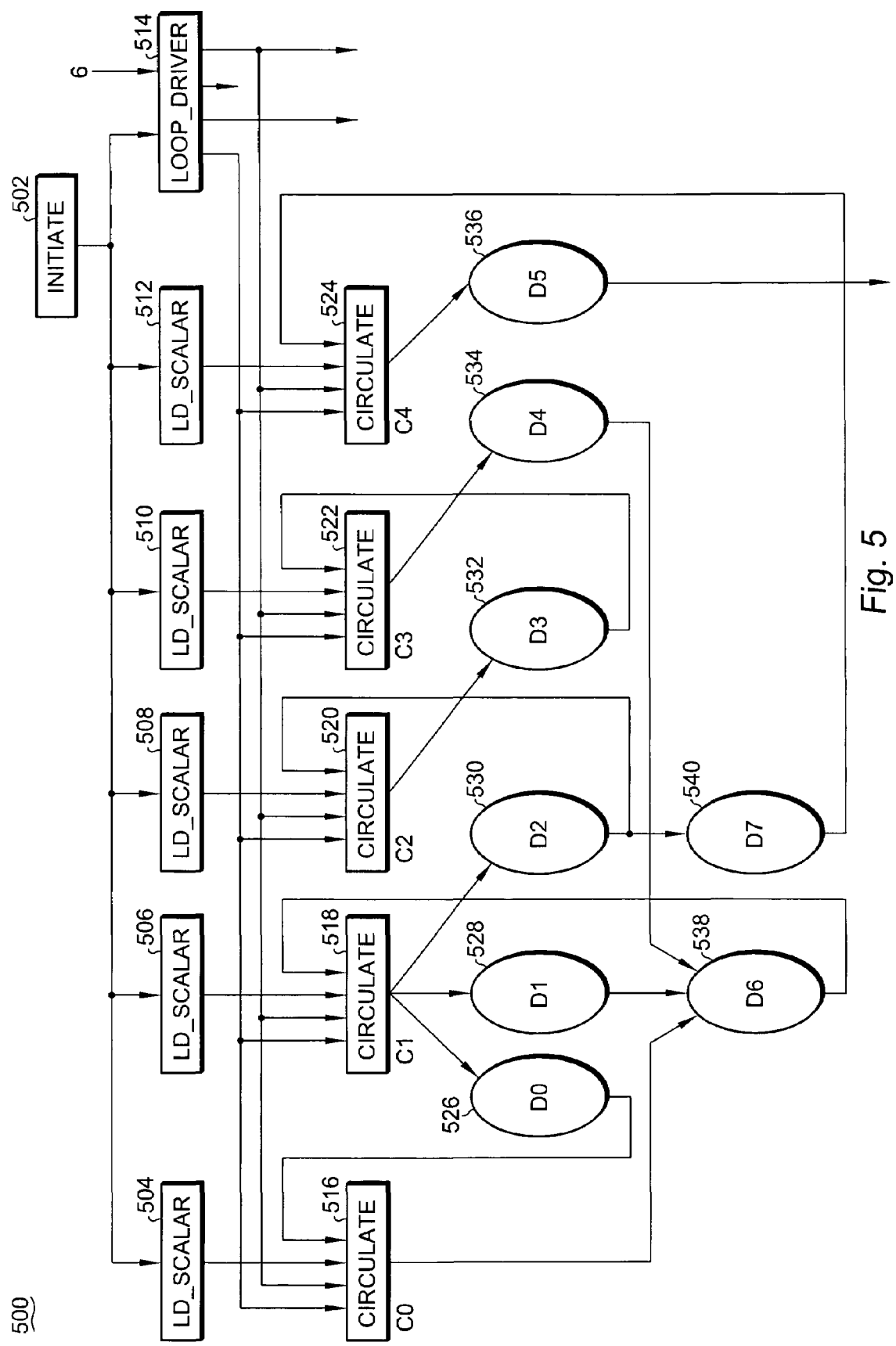
FIG. 5 shows an example of a control-dataflow graph pipelined loop structure having a number of loop-carried scalar cycles.

FIG. 5 show an even more complex pipelined loop structure 500 with many cyclical pathways between circulate nodes 516, 518, 520, 522, 524 and loop function bodies 526, 528, 530, 532, 534, 536, 538, 540. In this example, the execution of the loop structure 500 starts with the initiate node 502 sending a signal to the load scalar nodes 504, 506, 508, 510, 512 and the loop driver node 514. The D value to be input into the loop driver node 514 may be determined in the following manner:

The pipelined loop structure 500 has circulate nodes that can be divided into those that are involved in a cycle and those that are not. For the circulate nodes that are involved in a cycle, their cyclical pathways in the pipelined, loop structure can be described as follow:

1. C1→D1→D6→C1
2. C1→D0→D6→C1
3. C1→D2→C2→C3→D4→D6→C1 where C0, C1, C2, C3 and C4 are labels for circulate nodes 516, 518, 520, 522, and 524 respectively, and D0, D1, D2, D3, D4, D5, D6, and D7 are labels for loop function bodes 526, 528, 530, 532, 534, 536, 538, and 540, respectively.

When determining a value for D, the circulate nodes that are not involve in a cycle can be ignored because they will be pushed down into the loop body by inserting delays on all their inputs. In this example, the circulate (C4) node 524 us not involved in a cycle in pipelined loop structure 500 and is ignored when determining a value for D.

Figures 6, 7:
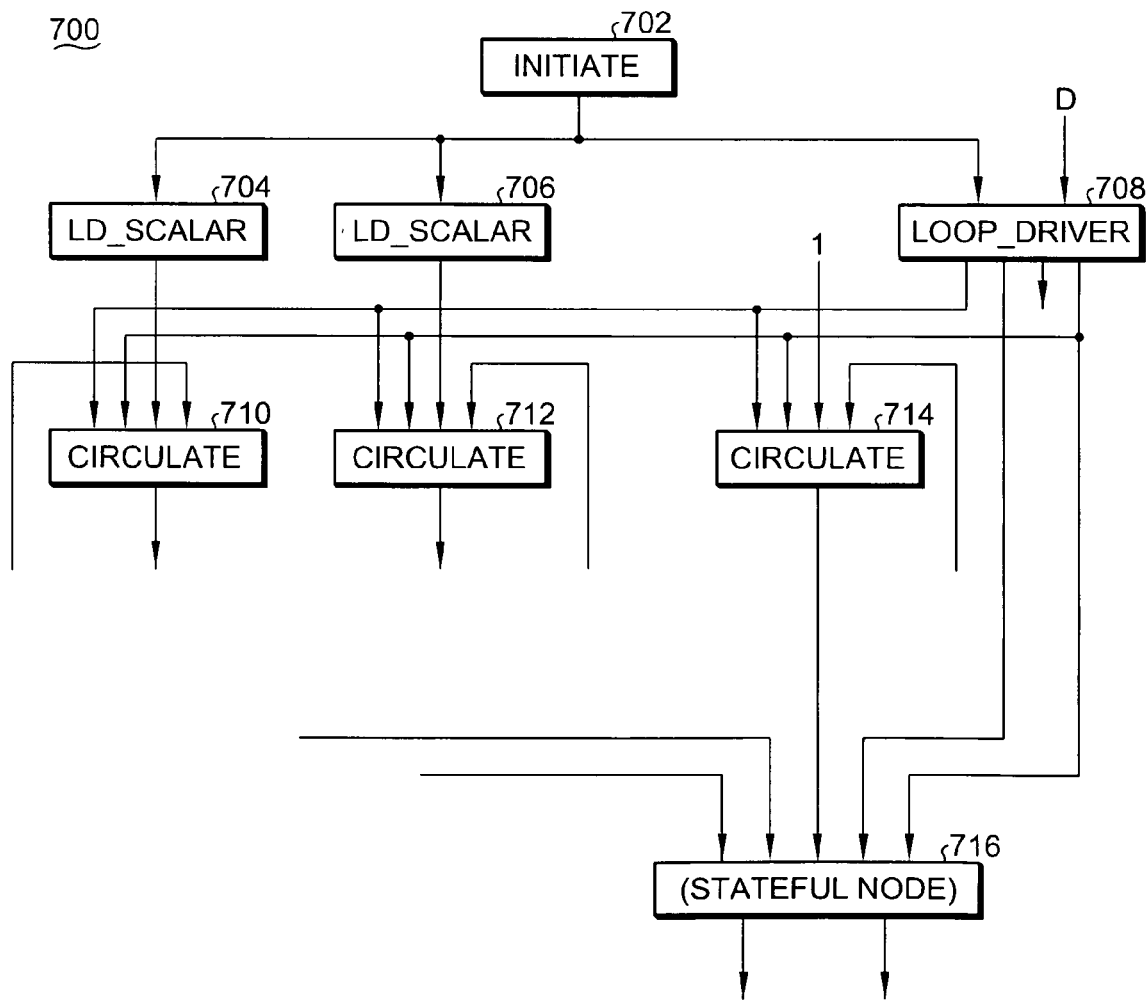
FIG. 6 shows an example of a chart that represents paths between CIRCULATE nodes for the loop structure illustrated in FIG. 5.
FIG. 7 shows an example of a control-dataflow graph pipelined loop structure that includes a stateful node.

For the remaining circulate (C0, C1, C2, C3) nodes 516, 518, 520, 522 a table like Table 1 shown in FIG. 6 may be developed that shows which loop function bodies a value travels through from one circulate node to another, or back to the same circulate node. For example, the cell C0,C0 identifies the loop function bodies that a value must travel through to get from circulate (C0) node 516 back to itself. In pipelined loop structure 500, C0 does not have a cyclical path back to itself, and the cell is left blank. In contrast, there is a cyclical path that a value can take from circulate (C1) node 518 back to itself, and this path is represented in cell C1,C1 as D1+D6.

The clock latency is determined for each of the loop function bodies D0–D6 and these latencies can be plugged into Table 1 to determine which cyclical path has the longest latency. The longest latency value may then be used to set the minimum value of D that is input into a loop driver node 514 to set the period for the whole pipelined loop structure 500.

Stateful Nodes

Stateful nodes may require additional support in a control-flow dataflow pipelined loop structure to handle issues with stateful nodes like clearing the node's state, telling the node when each iteration is taking place, and telling the node when its inputs are valid. FIG. 7 shows how three signals from the loop driver node 708 can be used to convey this information.

The example of a pipelined loop structure 700 shown in FIG. 7 looks similar to the other examples of pipelined loop structures except for the presence of stateful node 716. The loop function is executed by having the initiate node 702 send a signal to the load scalar nodes 704, 706 and the loop driver node 708. The load scalar nodes 704, 706 load initial values into the circulate nodes 710, 712, 714 while the loop driver node 708 sends activation signals to the circulate nodes 710, 712, 714 at a rate determined by the period of the loop. The circulate nodes 710, 712, 714 are coupled to one or more loop bodies (not shown) which, in turn are coupled to the stateful node 716.

As noted above, three signals are provided by the loop driver node 708 to convey information to the stateful node 716. The first of these signals is called a "valid" signal and reaches the stateful node 716 by way of circulate node 714 that is coupled to the loop driver node 708. The valid signal may also pass through conditional expressions if the stateful node exists inside a conditional.

The valid signal may be ignored by the stateful node 716 depending on how conditionals are structured in the loop function. When a conditional for a stateful node is handled by giving the node an explicit predicate input rather than placing the node inside a conditional test, then the valid signal can be ignored. As an illustrative example, consider two ways of handling an accumulator for summing all values of an array that are greater than 42:

```
for (1 = 0; i < N; i++) {
    a = A[i];
    if (a > 42)
        accum (a, &res);
}
as compared to:
    for (i = 0; i < N; i++) {
        a = A[i];
        accum (a, a > 42, &res);
    }
```

In the second approach, the loop structure build by the complier is simpler because it does not have to build conditional data flow. Moreover, in the second approach a value is assigned to 'res' in every iteration, whereas in the first approach a value is assigned to 'res' only when the conditional is true. Thus, when the accumulator is structured according to the second approach, a valid signal input for a stateful node is not required and the signal can be ignored. If the valid signal is desired, the stateful node may be designed with a one-bit input for accepting the signal.

A second signal for the stateful node 716 is a "starting" signal that is used to clear the internal state of the node. This signal may be generated by the loop driver node 708 at a loop_starting output. Stateful node 716 is not connected to he "code_block_reset" signal of the code block if signals from the loop driver node 708 are passed through delays before reaching the stateful node 716. This is because, on entrance to the code block, the loop could still be free-running from a previous execution of the block and if the "code_block_reset" signal is not passed through delays, using that signal could allow the node to reset and begin processing values that are still flowing from a previous execution of the code block.

A third signal input for the stateful node 716 is a signal that goes high on the last clock cycle of each loop iteration. This signal may original from the loop driver node 708 as the "active_last" signal. When stateful node 716 sees this signal high, it assumes that there is valid data on its inputs.

Normally, stateful node 716 does not concern itself with loop termination. When the loop's termination condition is met, the corresponding results will be captured, and the loop will continue to run. However, there may be instances where the stateful node 716 should retain its state for the next time the loop's code block is executed, and would want to know when the loop has terminated. In this case, the macro will use the "valid" input and will not reset when it sees the "starting" signal, since its state is meant to be preserved across code block invocations.

Figure 8:
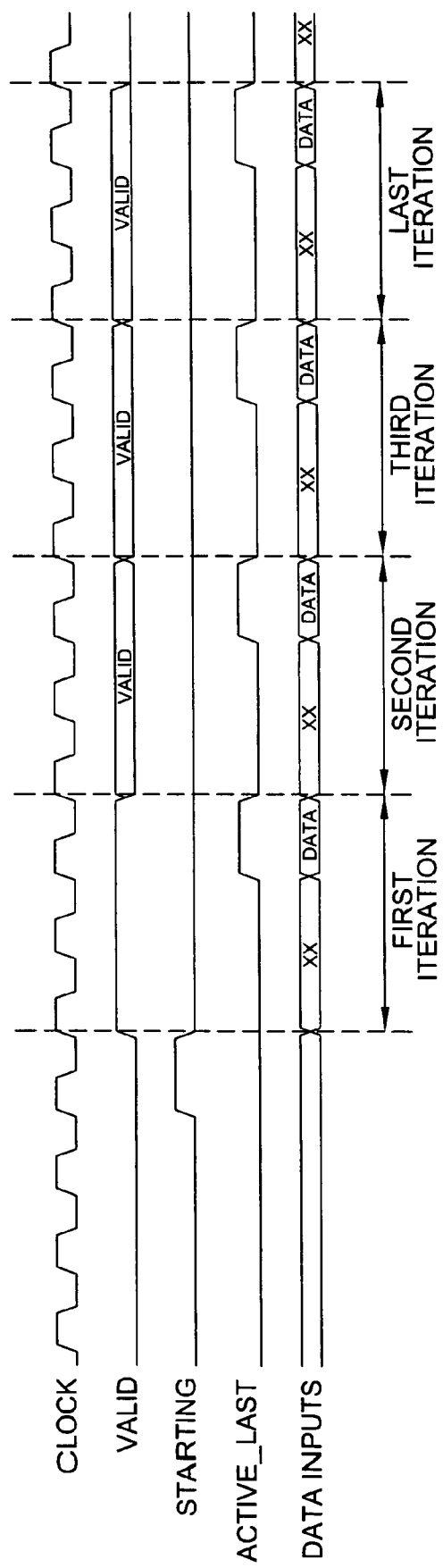
FIG. 8 shows an example of a timing diagram for a stateful node macro.

FIG. 8 shows an example timing diagram for the signals that may be used with stateful node 716. In this example, a "valid" signal is high during the first iteration, since the loop is a bottom-test loop that executes at least one iteration. Thereafter, a high "valid" signal indicates that the loop has not terminated and that if the node is inside of a conditional, that conditional branch is taken. The "starting" signal goes high for one clock before the loop starts. It can be used to clear the state of the stateful node 716. The "active_last" signal goes high on the last clock cycle of each loop iteration, and it continues with this behavior even after the loop has terminated. Data inputs to the stateful node 716 can be assumed valid when the "active_last" signal is high.

The "leading" signal provides proper synchronization to periodic-input nodes. Some nodes are not able to accept new inputs on every clock cycle. For example, an integer multiply may reuse a single on-chip multiplier so that it can accept inputs only on every third clock. This issue is orthogonal to the issue of latency, which is the number of clock delays between a set of inputs and its corresponding outputs. If a node cannot accept inputs on every clock, the it needs to be in an environment where the inputs are paced properly, and there should be synchronization establishing when the node takes in its new inputs. This is the function that is provided by the "leading" signal. It can be connected to a "valid in" input of such a node. The D value of the loop driver node should also be set so that it slows the loop down at least enough for a periodic-input node to operate correctly.

There are at least two varieties of stateful nodes that may be used with the present invention: In one variety, the latency of the node is constant regardless of the loop's iteration period (i.e., regardless of the value of the D input on the loop driver node). In another variety, the latency of the stateful node varies based on the loop's iteration period. For example, the stateful node that takes N data items before it begins to produce its outputs will consume a larger number of clock cycles before the first result is produced if the loop is slowed down by the loop driver node. This kind of stateful node behavior is specified in it info file entry. A node writer may elect to write such a stateful node such that it will function correctly only when the loop is not slowed down, i.e. D=0, and the node's info file entry must specify that is the case.

The words "comprise," "comprising," "include," "including," and "includes" when used in this specification and in the following claims are intended to specify the presence of stated features, integers, components, or steps, but they do not preclude the presence or addition of one or more other features, integers, components, steps, or groups.

I claim:

1. A reconfigurable computer system including control-flow dataflow pipelined loop structures, the system comprising:
   a multi-adaptive processor, wherein the multi-adaptive processor includes field programmable gate arrays; and
   a multi-adaptive processor compiler capable of creating code executable on the multi-adaptive processor, wherein the multi-adaptive processor compiler creates code forming a pipelined loop structure, the pipelined loop structure comprising;
   a loop body that processes an input value to generate an output value in successive iterations of the loop body, wherein the output value is captured by a circulate node coupled to the loop body;
   a loop valid node coupled to the loop body that determines a final loop iteration; and
   an output value storage node coupled to the circulate node, wherein the output value storage node ignores output values generated after the loop valid node determines the final loop iteration has occurred preserving a final loop value based on the final loop iteration.

2. The pipelined loop structure of claim 1, wherein the loop valid node outputs a loop-valid termination signal upon determining the final loop iteration has occurred.

3. The pipelined loop structure of claim 2, wherein the loop valid node outputs the loop-valid termination signal for every loop iteration after the final loop iteration has occurred, until the loop is reinitiated.

4. The pipelined loop structure of claim 2, wherein the loop-valid termination signal comprises a data bit.

5. The pipelined loop structure of claim 1, comprising a termination node copied to the loop valid node and the output value storage node.

6. The pipelined loop structure of claim 5, wherein the termination node comprises a termination input to receive the loop-valid termination signal from the loop valid node.

7. The pipelined loop structure of claim 6, wherein the termination node comprises a termination output to send a storage node termination signal to the output value storage node.

8. The pipelined loop structure of claim 1, wherein the pipelined loop structure comprises a loop driver node coupled to the circulate node, wherein the loop driver node sets a period for each iteration of the loop body.

9. The pipelined loop structure of claim 8, wherein clock latency is based on a period value that is input into the loop driver node.

10. A reconfigurable computer system including a multi-adaptive processor and a multi-adaptive compiler, the multi-adaptive compiler capable of converting high level instructions into code executable in the multi-adaptive processor, including instructions for forming a control-flow dataflow pipelined loop structure, the pipelined structure comprising:
    a loop body that processes a first input value to generate an output value in successive iterations of the loop body, wherein the output value is captured by a circulate node coupled to the loop body; and
    a loop driver node coupled to the circulate node, wherein the loop driver node sets a period for each iteration of the loop body such that one or more clock cycles pass before the loop body processes a second input value, and wherein the loop drive node outputs signals related to stateful functional units.

11. The pipelined loop structure of claim 10, wherein the loop driver node outputs a CIRC_TRIGGER signal to tell the circulate node that a loop is starting.

12. The pipelined loop structure of claim 10, wherein the loop driver node outputs a START signal to trigger the start of a loop.

13. The pipelined loop structure of claim 10, wherein the loop driver node outputs a LOOP—STARTING signal to clear the state of a node that requires a reset pulse.

14. The pipelined loop structure of claim 10, wherein the loop driver node outputs a LEADING signal to tell a periodic-input node to load a value.

15. The pipelined loop structure of claim 10, wherein the period value equals the period of the longest loop-carried scalar cycle in the pipelined loop structure.

16. The pipelined loop structure of claim 10, wherein the period is based on a period value that is input into the loop driver node.

17. The pipelined loop structure of claim 10, comprising a loop valid node coupled to the loop body that determines a final loop iteration.

18. The pipelined loop structure of claim 17, wherein the loop valid node outputs a loop-valid termination signal upon determining the final loop iteration has occurred.

19. The pipelined loop structure of claim 18, comprising an output value storage node coupled to the circulate node.

20. The pipelined loop structure of claim 19, wherein the output value storage node ignores output values generated after the loop valid node determines the final loop iteration has occurred.

21. The pipelined loop structure of claim 20, comprising a termination node coupled to the loop valid node and the output value storage node.

* * * * *

UNITED STATES PATENT AND TRADEMARK OFFICE
CERTIFICATE OF CORRECTION

PATENT NO.         : 7,134,120 B2
APPLICATION NO. : 10/345082
DATED                : November 7, 2006
INVENTOR(S)       : Jeffrey Hammes Page 1 of 1

It is certified that error appears in the above-identified patent and that said Letters Patent is hereby corrected as shown below:

Column 8, line 36, "copied" should be --coupled--

Column 10, line 7, "18,comprising" should be --18, comprising--

Signed and Sealed this

Thirtieth Day of January, 2007

JON W. DUDAS
*Director of the United States Patent and Trademark Office*